United States Patent [19]

Yagi et al.

[11] Patent Number: 5,159,605
[45] Date of Patent: Oct. 27, 1992

[54] SEMICONDUCTOR-LASER-PUMPED, SOLID-STATE LASER

[75] Inventors: Shigenori Yagi; Takashi Yamamoto; Mayumi Fujimura, all of Amagasaki, Japan

[73] Assignee: Mitsubishi Denki Kabushiki Kaisha, Japan

[21] Appl. No.: 641,279

[22] Filed: Jan. 15, 1991

[30] Foreign Application Priority Data

| Jan. 19, 1990 | [JP] | Japan | 2-11559 |
| Jul. 31, 1990 | [JP] | Japan | 2-205793 |
| Oct. 15, 1990 | [JP] | Japan | 2-278250 |

[51] Int. Cl.$^5$ ............................................. H01S 3/094
[52] U.S. Cl. ................................. 372/75; 372/6; 372/66; 372/71
[58] Field of Search ............ 372/75, 50, 70, 71, 372/66, 6

[56] References Cited

U.S. PATENT DOCUMENTS

| 3,284,722 | 11/1966 | Gray | 331/94.5 |
| 3,803,511 | 4/1974 | Thompson | 331/94.5 |
| 3,892,201 | 9/1976 | Rosenkrantz et al. | 331/95.4 P |
| 4,739,507 | 4/1988 | Byer et al. | 372/22 |
| 4,780,877 | 10/1988 | Snitzer | 372/71 |
| 4,782,491 | 11/1988 | Snitzer | 372/6 |
| 4,785,459 | 11/1988 | Baer | 372/75 |
| 4,794,615 | 12/1988 | Berger et al. | 372/69 |
| 4,829,529 | 5/1989 | Kafka | 372/6 |
| 4,847,851 | 7/1989 | Dixon | 372/75 |

FOREIGN PATENT DOCUMENTS

| 0078941 | 5/1983 | European Pat. Off. . |
| 0138411 | 4/1985 | European Pat. Off. . |
| 0208189 | 1/1987 | European Pat. Off. . |
| 0375216 | 6/1990 | European Pat. Off. . |
| 1-122180 | 5/1989 | Japan . |
| 2-5490 | 1/1990 | Japan . |
| 1016776 | 6/1963 | United Kingdom . |
| 1279161 | 6/1972 | United Kingdom . |
| 1507534 | 4/1978 | United Kingdom . |
| 2231412 | 11/1990 | United Kingdom . |

OTHER PUBLICATIONS

Dixon et al, "Lithium Neodymium . . . Diode Arrays", IEEE Photonics Technology Letters, vol. 1, No. 5, May 1989, pp. 97–99.

*Primary Examiner*—James W. Davie
*Attorney, Agent, or Firm*—Leydig, Voit & Mayer

[57] ABSTRACT

A semiconductor-laser-pumped, solid-state laser includes a semiconductor pumping laser emitting pumping light, a solid-state laser medium arranged to be excited by the pumping light, and a laser resonator structure for emitting laser light from the solid-state laser medium. The solid-state laser medium is plate shaped having a thickness less than the broadening width of the pumping light in the solid-state laser medium. The semiconductor laser is arranged close to the face of the solid-state laser medium, and the laser resonator structure has optical axis coinciding with that of the pumping light.

13 Claims, 13 Drawing Sheets

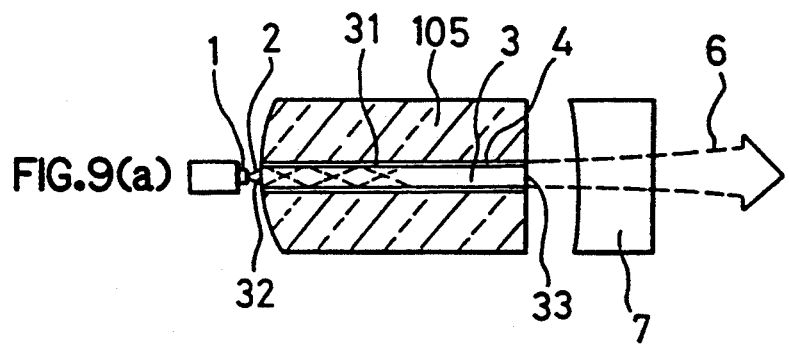
FIG.9(a)
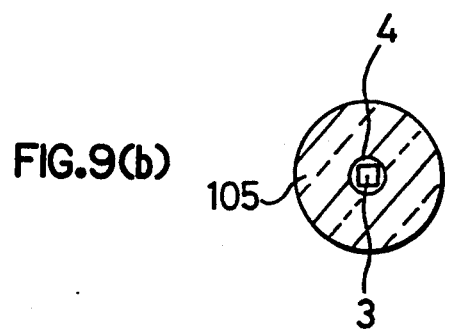
FIG.9(b)
FIG.10
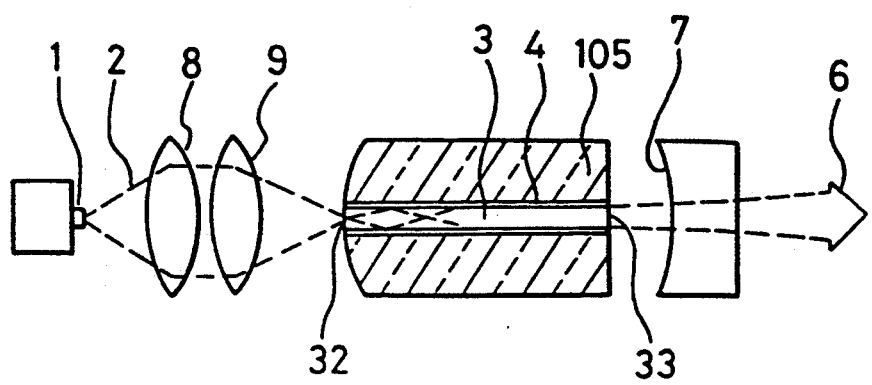

SEMICONDUCTOR-LASER-PUMPED, SOLID-STATE LASER

FIELD OF THE INVENTION

The present invention relates to a solid state laser having a semiconductor laser as a pumping source and, more particularly, to a semiconcuctor laser-pumped, solid state laser with enhanced oscillation efficiency and beam quality.

BACKGROUND OF THE INVENTION

FIGS. 24(a) and 24(b) show a prior art semiconductor laser-pumped, solid state laser described in Japanese Published Patent Application 1-122180. FIG. 24(a) shows the entire structure thereof and FIG. 24(b) shows a cross-section taken along line B—B of FIG. 24(a). In FIGS. 24(a) and 24(b), reference numeral 1 designates a semiconductor laser which emits pumping light. The pumping laser is mounted on a heat sink 102. Numeral 103 designates a linear lens. A solid state laser medium 3 comprising, for example, an yttrium aluminum garnet (YAG) crystal is pumped by the pumping light from the semiconductor laser. Numeral 205 designates a film which selectively reflects light and numeral 106 designates a film which totally transmits light. Numerals 70 and 7 designate a totally reflecting mirror and a partially reflecting mirror, respectively. Numeral 2 designates pumping light and numeral 6 designates laser light. Hereinafter, the light emitted from the semiconductor laser 1 is called pumping light and the light emitted from the solid state laser medium 3 is called laser light.

The divergence of the pumping light 2 emitted from the semiconductor laser 1 is narrowed by the linear lens 103 and is incident on the solid state laser medium 3. Narrowing the divergence angle of the light emitted from the semiconductor laser 1 does not lower the pumping light density which is important to obtain a high laser oscillation efficiency. The selective reflecting film 205 has a reflection selectivity that transmits the pumping light 2 and totally reflects the laser light 6. By constructing the optical path in a zigzag configuration in the solid state laser medium 3 in the resonator space between the totally reflecting mirror 70 and the partially reflecting mirror 7, laser light 6, as shown in FIG. 24(a), is produced.

FIG. 23 shows a schematic diagram of a prior art semiconductor laser-pumped, solid state laser described in Mitsubishi Denki Gihoh, Volume 23, Number 4, 1989, pages 287-290. In FIG. 23, numeral 1 designates a semiconductor laser as a pumping light source, and numeral 2 designates a laser beam emitted from the semiconductor laser 1, called pumping light hereinafter. Numerals 8 and 9 designate lenses. Numeral 3 designates a solid state laser medium pumped by the pumping light. Numeral 6 designates laser light emitted from the solid state laser medium 3. Numeral 7 designates a partially reflecting mirror. A totally reflecting coating 32 and a non-reflecting coating 33 which respectively totally reflect and partially reflect the laser light 6 are disposed on the facets of the solid state laser medium, respectively, and, thereby, a laser resonator is formed between the totally reflecting coating 32 and the partially reflecting mirror 7.

The pumping light 2 emitted from the semiconductor laser 1 is collimated by the lens 8 and is concentrated on the solid state laser medium 3 by the lens 9. The pumping light 2 is absorbed and broadens in the solid state laser medium 3 and, thereby, the solid state laser medium 3 is excited. Part of the energy of the pumping light 2 that is absorbed is output as laser light 6.

The conventional semiconductor laser-pumped, solid state laser constructed as described above has the following drawbacks.

In the semiconductor laser-pumped, solid state laser shown in FIG. 24(a), when the divergence angle of the pumping light is large. the idle pumping light which does not contribute to the laser light increases and the pumping efficiency is reduced. The divergence angle of the pumping light in the solid state laser medium varies significantly depending on the positional relationships between the semiconductor laser, the linear lens, and the solid state laser medium that are difficult to establish stably. In addition, in this semiconductor laser-pumped, solid state laser, the optical axes of the laser light and the pumping light must be accurately aligned on the selective reflecting film. However, as the pumping light increases, the thermal distribution in the solid state laser medium changes and the refractive index distribution rises, so that the position of the optical axis varies and deviates from the location where the pumping light is incident. In addition, the optical loss at the selective reflection film is generally large and the total resonator loss increases as the number of reflections increases. Moreover, it is difficult to obtain high power output by arranging a plurality of semiconductor lasers in parallel.

In the semiconductor laser-pumped, solid state laser device of FIG. 23, the broadening of pumping light 2 in the solid state laser medium 3 is large and it is impossible to substantially reduce the pumping cross-section. Therefore, the threshold of laser oscillation is increased, thereby reducing the energy efficiency of the laser oscillation. In addition, the laser light 6 includes many higher order modes and it is difficult to produce a fundamental mode beam which has a good light collecting property.

SUMMARY OF THE INVENTION

The present invention is directed to solving the above-described problems and provides a semiconductor laser-pumped, solid state laser with enhanced laser oscillation efficiency and stable laser oscillation.

Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

In accordance with a first aspect of the present invention, a solid state laser medium is thin, flat, and plate-shaped having a rectangular or small circular cross-section, and a semiconductor pumping laser is disposed close to a facet of the solid state laser medium. The pumping light is incident on the solid state laser medium and the laser resonator is a stable type or a waveguide type having an optical axis coinciding with that of the pumping light. Therefore, the pumping light is confined in a narrow region by internal reflection in the solid state laser medium having a narrower thickness and width than the broadening width of pumping light and is absorbed therein, whereby the energy efficiency of laser oscillation is enhanced.

In accordance with a second aspect of the present invention, a solid state laser medium is thin, flat, and plate-shaped and a semiconductor pumping laser is disposed close to the side face of the solid state laser medium. The pumping light is incident on the side face of the solid state laser medium and the laser resonator is a stable type or a one-dimensional unstable type having an optical axis perpendicular to the optical axis of the pumping light. Therefore, by aligning the optical axis of the pumping laser with the lengthwise direction of the medium, the region the optical axis passes through is broadened throughout the medium whereby, even if the positional relationship between the pumping light and the laser light deviates, stable operation is possible.

In accordance with a third aspect of the present invention, a solid state laser medium is thin, flat, and plate-shaped having a rectangular or small circular cross-section, and the solid state laser medium is mounted with a holding substance and optically polished. Therefore, a surface having the most appropriate curvature can be easily produced and a high efficiency and high beam quality laser is realized.

In accordance with a fourth aspect of the present invention, a solid state laser medium is thin, flat, and plate-shaped having a rectangular or small circular cross-section and the solid state laser medium is fixed to a metal block with an optical adhesive. Therefore, the cooling of the solid state laser medium and the mounting with other parts, such as the pumping laser diode and output mirror, are simplified and a high efficiency and high beam quality solid state laser is produced.

BRIEF DESCRIPTION OF THE DRAWINGS

FIGS. 9(a) and 9(b) are vertical and transverse cross-sectional diagrams showing a semiconductor laser-pumped, solid state laser in accordance with an eighty embodiment of the present invention.

FIGS. 10 and 11 are cross-sectional diagrams showing a semiconductor laser-pumped, solid state laser in accordance with a ninth and a tenth embodiment of the present invention, respectively.

DETAILED DESCRIPTION OF THE PREFERRED EMBODIMENTS

Figures 1A, 1B:
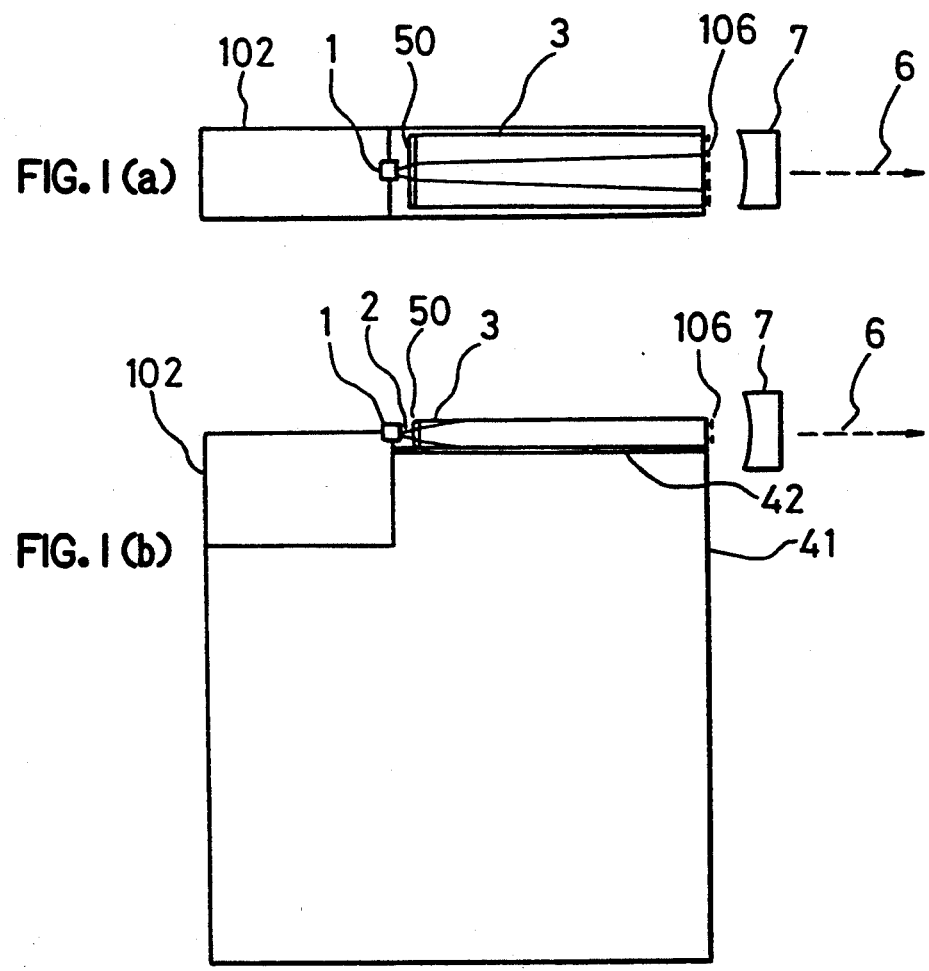
FIGS. 1(a) and 1(b) are diagrams showing a semiconductor laser-pumped, solid state laser in accordance with a first embodiment of the present invention.
Figure 23:
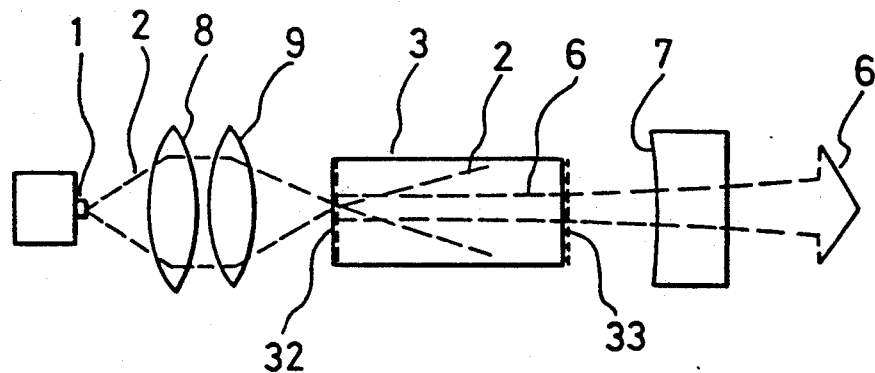
FIG. 23 is a diagram showing a structure of a prior art semiconductor laser-pumped, solid state laser.
Figure 24A:
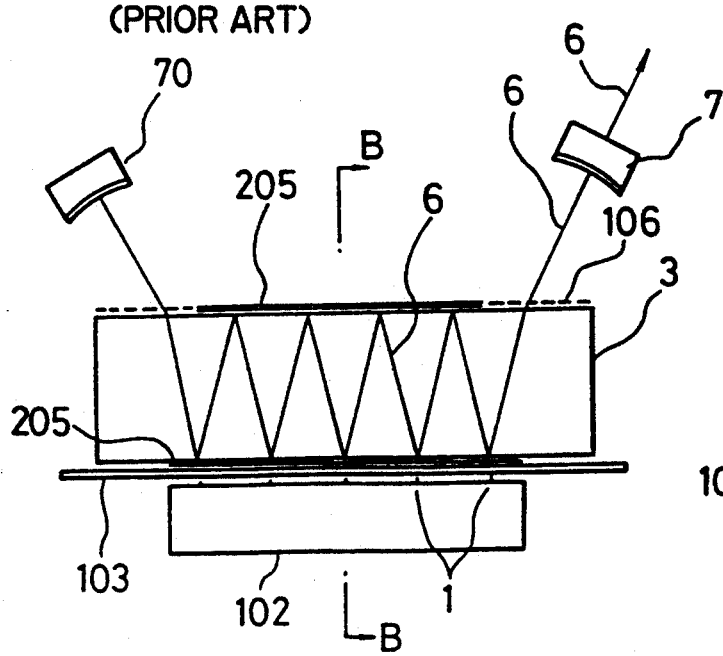
FIGS. 24(a) and 24(b) are diagrams showing the structure of another prior art semiconductor laser-pumped, solid state laser.
Figure 24B:
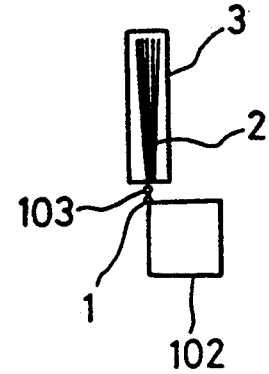

FIGS. 1(a) and 1(b) are diagrams showing a semiconductor laser-pumped, solid state laser in accordance with a first embodiment of the present invention. FIG. 1(a) is a perspective view from above and FIG. 1(b) is a transverse cross-sectional view. In those figures, the same reference numerals as those in FIGS. 23, 24(a), and 24(b) are used for the same or corresponding elements. Reference numeral 50 designates a selective reflecting film and a stable resonator comprises the selective reflecting film 50 and the partially reflecting mirror 7. Reference numeral 41 designates a base block for mounting the solid state laser medium 3 and a reflecting film 42 is disposed on the base block 41 between the base block 41 and the solid state laser medium 3.

The pumping light 2 emitted from the semiconductor laser 1 generally has a large anisotropic divergence angle, such as 60° in the vertical direction and 20° in the horizontal direction of the active layer. Here, the pumping laser 1 is arranged such that the direction of the larger divergence angle of the laser 1 is aligned with the thickness direction of the solid state laser medium 3.

The pumping light 2 of the semiconductor laser 1 is incident on the laser medium 3. The introduced light 2 is absorbed in the laser medium 3 in accordance with the refractive index difference and the transmitted portion of the broadening pumping light 2 is reflected by the reflecting film 42 and again confined in the solid state laser medium 3. Thus, the pumping light 2 is effectively absorbed. The thickness of the solid state laser medium 3 is small relative to the broadening width of the pumping light 2 in the solid state laser medium 3, thereby preventing the region of pumping light from becoming very large relative to the region of the laser light 6. Therefore, the energy efficiency of laser oscillation is high. An oscillation experiment was carried out using the apparatus of FIG. 1(a) and it was possible to obtain, as a measured value, a YAG output of 200 mW for the pumping laser output 730 mW. Therefore, it was possible to enhance the oscillation efficiency relative to that when a semiconductor laser output of 1 W is required to produce a YAG output of 200 mW in the prior art lens focusing type device.

In this first embodiment, since the region through which the laser light passes is broadened throughout the medium, the positional relationship between the pumping light 2 and the laser beam 6 is not required to be highly precise. The positional precision of the pumping laser 1 and the solid state laser medium 3 mounted on the base block 41 needs only to fall within a range of mechanical precision.

In the first embodiment, a reflecting film 42 is disposed only at the lower surface of the laser medium 3, but a reflecting film can also be disposed at the upper surface of the laser medium 3 as required. However, when the divergence angle of the pumping light 2 is not so large, the reflecting film 42 can be dispensed with because the pumping light 2 is totally reflected by the side face of the medium even when the difference in the refractive indexes within and outside the laser medium 3 is not so large.

In addition, it is also possible to adhere a lens to the incident facet of the laser medium 3, whereby the pumping light 2 can be confined in the solid state laser medium 3 and better absorbed therein.

Figure 2:
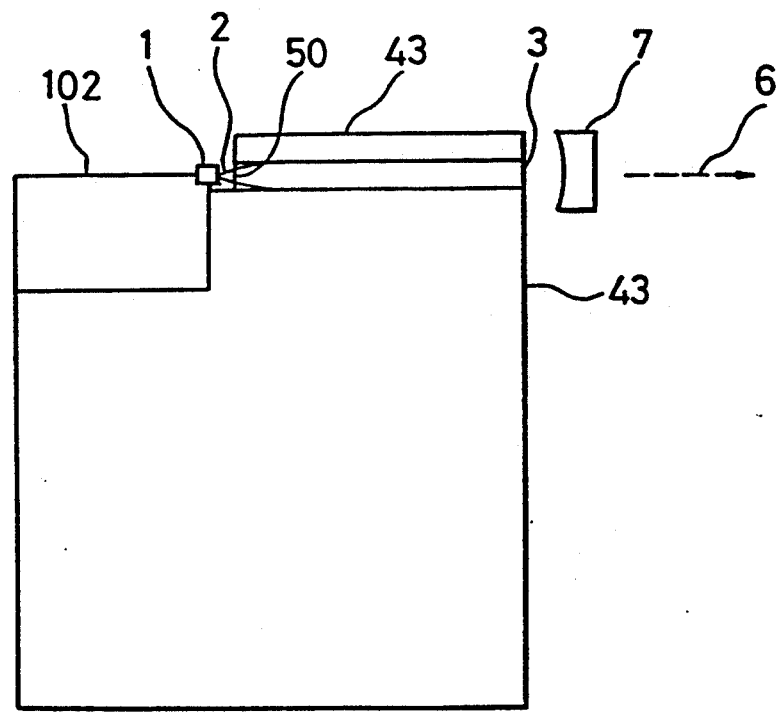
FIGS. 2, 3(a), and 3(b) are diagrams showing a semiconductor laser-pumped, solid state laser in accordance with a second and a third embodiment of the present invention, respectively.

FIG. 2 shows a second embodiment of the present invention. In this embodiment, upper and lower high dielectric constant guides 43 are arranged with the solid state laser medium 3 disposed between them. For example, a metal is used for the high dielectric constant guides 43. Therefore, a waveguide resonator is produced in the plane of the thickness direction of the solid state laser medium 3 between the selective reflecting film 50 and the partially reflecting mirror 7.

Figure 3A:
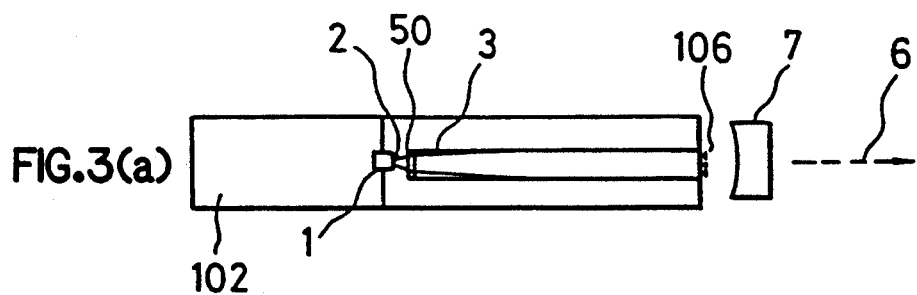
Figure 3B:
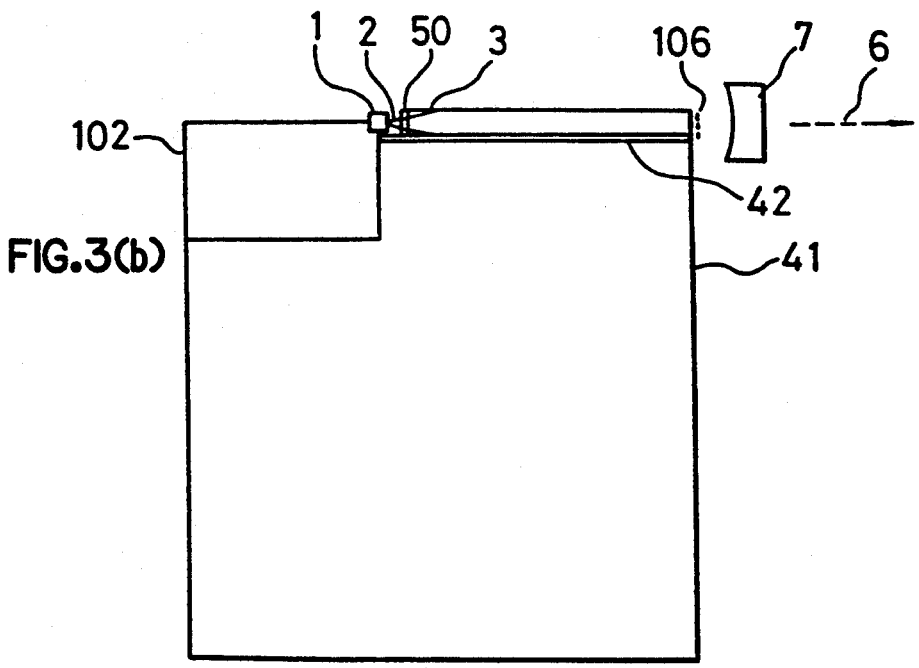

FIGS. 3(a) and 3(b) show a third embodiment of the present invention. The solid state laser medium 3 is thin in the width direction, perpendicular to the thickness direction, and this construction confines the pumping light 2 to a narrower region. In this case, the cross-sectional configuration of the solid state laser medium 3 can be rectangular, polygonal, or circular with almost the same effect.

Figure 4:
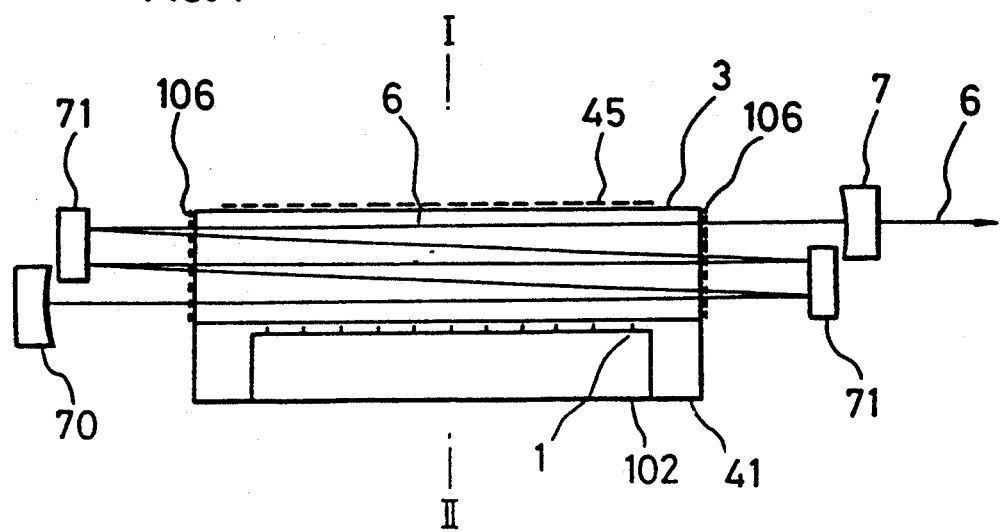
FIG. 4 is a diagram showing a semiconductor laser-pumped, solid state laser in accordance with a fourth of the present invention.
Figure 5:
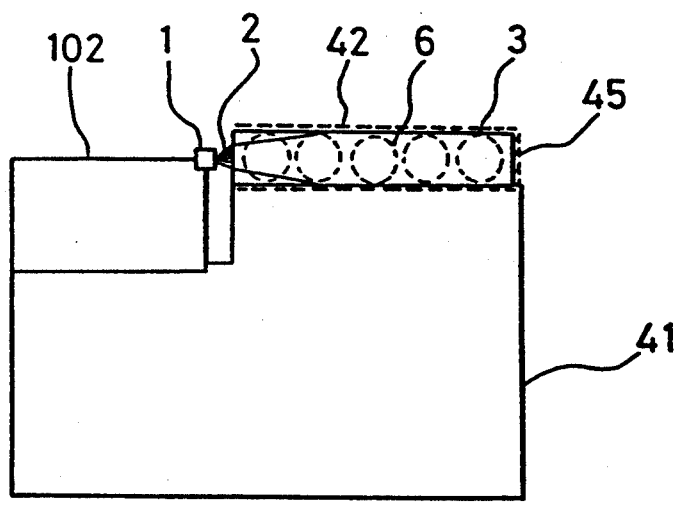
FIG. 5 is a diagram showing a cross-section taken along line I-II of FIG. 4.

FIG. 4 is a schematic diagram showing a semiconductor laser-pumped, solid state laser in accordance with a fourth embodiment of the present invention and FIG. 5 is an enlarged cross-section taken along line I-II of FIG. 4. In these figures, numeral 41 designates a base block and numerals 42 and 45 designate reflecting films. Totally reflecting mirrors 70 and 71 and a partially reflecting mirror 7 constitute, together with the solid state laser medium, a stable resonator.

The pumping light 2 of the semiconductor laser 1 has a large anisotropic divergence angle, such as 60° in the vertical direction and 20° in the horizontal direction of the active layer. Therefore, the pumping light 2 incident on the laser medium 3 is placed close to the semiconductor laser 1. Part of the laser light 2 is transmitted and part is absorbed in a large divergence angle in accordance with the refractive index difference. The outside portions of the broadened pumping light 2 are reflected by the reflecting film 42 and confined in the laser medium 3. Therefore, the pumping light is effectively absorbed. The thickness of the solid state laser medium 3 is thin relative to the broadening width of the pumping light 2 in the solid state laser medium 3 and the laser beam 6 fills almost the entire cross-section of the solid state laser medium 3. The pumping region is prevented from becoming large relative to the laser beam region. Therefore, the energy efficiency of the laser oscillation is high. In addition, the positional relationship between the pumping light 2 and the laser beam 6 is not required to be highly precise and a parallel arrangement of a plurality of pumping lasers 1 can be constructed such that the solid state laser medium 3 and the pumping lasers 1 are mounted at predetermined positions on the base block 41 within a range of mechanical precision.

In the above-described fourth embodiment, reflecting films 42 are disposed at the lower and the upper surfaces of the solid state laser medium 3, but in a case where the divergence angle of the pumping light 2 is not so large, the pumping light is totally reflected by the side faces of the medium 3 even when the difference in the refractive indexes within and outside the laser medium 3 is not so large. Therefore, the reflecting film 42 can be dispensed with.

Figure 6:
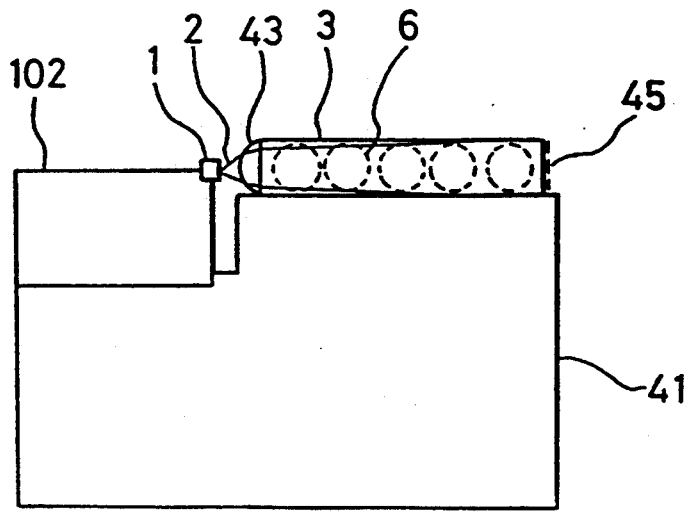
FIG. 6 is a cross-sectional view showing a fifth embodiment of the present invention.

FIG. 6 shows an enlarged cross-section of a fifth embodiment of the present invention. In this alternative embodiment, a lens 43 is adhered to the solid state laser medium 3 and the pumping light is better confined and absorbed in the solid state laser medium 3.

Figure 7:
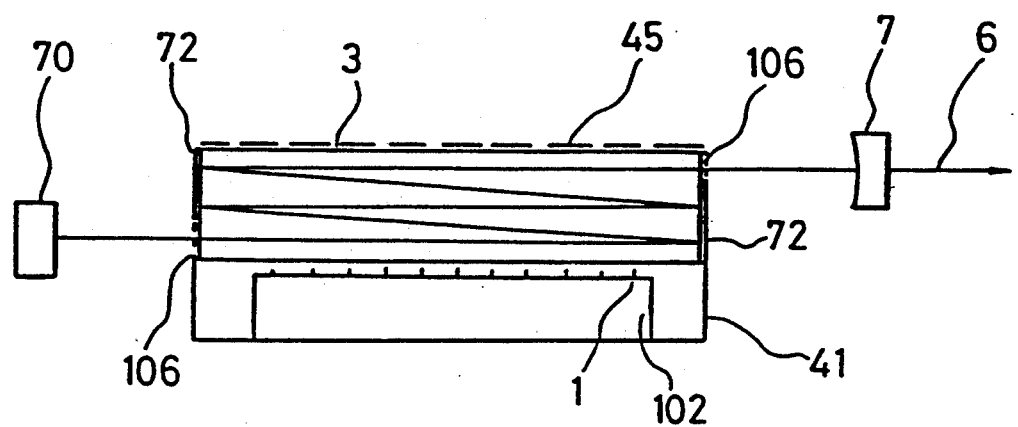
FIGS. 7 and 8 are diagrams showing a semiconductor laser-pumped, solid state laser in accordance with a six and a seventh embodiment of the present invention, respectively.

FIG. 7 is a diagram showing a sixth embodiment of the present invention. In FIG. 7, reference numeral 72 designates a totally reflecting film which is a coating on the facet of the solid state laser medium 3. In this embodiment, by providing totally reflecting films 72 directly on the facet of the solid state laser medium 3, the totally reflecting mirror 71 can be dispensed with, whereby the resonator is simplified.

Figure 8:
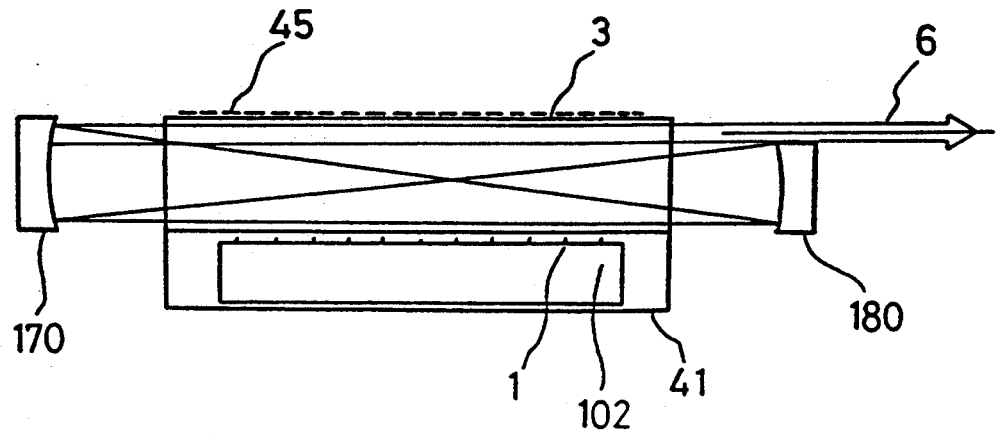

FIG. 8 is a diagram showing a seventh embodiment of the present invention. In FIG. 8, numeral 170 designates a collimating mirror and numeral 180 designates an enlarging mirror. In this embodiment, a laser resonator comprises a one-dimensional unstable resonator including the collimating mirror 170 and the enlarging mirror 180 in the plane parallel to the surfaces of the flat, plate-shaped solid state laser medium 3. A stable resonator or a waveguide resonator in the plane perpendicular to the above-described plane are achieved in this embodiment.

FIGS. 9(a) and 9(b) show a vertical cross-sectional structure and a transverse cross-sectional structure in accordance with an eighth embodiment of the present invention, respectively. In FIG. 9(a), numeral 1 designates a semiconductor pumping laser which generates a pumping light 2. Numeral 3 designates a solid state laser medium having a thickness and width less than the broadening width of the pumping light and comprising, for example, an Nd:YAG ($Y_{3-x}Nd_xAl_5O_{12}$) crystal having a length of 10 mm and a square cross-section having a side of 0.3 mm. A reflection coating 31 on the side faces of the Nd:YAG crystal reflects the pumping light 2. Numeral 4 designates an adhesive and numeral 105 designates a holding substance comprising, for example, a glass or YAG crystal which has, for example, a length of 10 mm and a diameter of 3 mm. Numeral 32 designates a first coating on the facet of the solid state semiconductor laser medium 3 which is non-reflecting for the pumping light 2 and totally reflecting for the laser light 6. Numeral 33 is a second coating on the facet of the solid state laser medium 3 which is of high reflectance for the pumping light 2 and non-reflecting for the laser light 6. Numeral 7 designates a partially reflecting mirror. Here, the solid state laser medium 3 and the holding substance 105 are integrated by the adhesive 4. Therefore, a laser resonator can be easily produced with high precision by optically polishing and coating the facet. The pumping light 2 emitted from the semiconductor laser 1 has a large anisotropic divergence. For example, the divergence angle is 60° in the vertical direction and 20° in the horizontal direction of the active layer of the semiconductor laser 1. Thus, in this embodiment, the semiconductor pumping laser 1 and the solid state laser medium 3 are disposed close to each other and the facet of the solid state laser medium 3 is disposed in the vicinity of a point where the radius of the pumping light is a minimum, whereby the pumping light beam 2 is effectively introduced into the solid state laser medium 3.

Generally, when a hard material, such as a YAG crystal, is a bar shape having small cross-section, it is quite difficult to produce the curvatures required for a laser resonator at the facet. In this embodiment, the YAG crystal is cut out as a square, long bar. The bars are buried in and adhered to the holding substance and the holding substance including the YAG crystal is cut to a desired length. The facets are polished and coated as required. Therefore, the processing of the solid state laser medium can be performed easily and with high precision.

The pumping light 2 is incident from the facet of the solid state laser medium 3 to which a coating 32 has been applied and the introduced pumping light 2 has repeated internal reflections at the reflecting coating 31 on the side face of the solid state laser medium 3. The pumping light 2 is absorbed in the solid state laser medium 3 while repeating reflections therein and it effectively excites the laser medium 3 while being confined therein. In this embodiment, the cross-section of the solid state laser medium 3 is small relative to the natural broadening of the pumping light 2 and the pumping region is prevented from becoming large relative to the region of the laser light. In the solid state laser of FIG. 9(a), a stable resonator exists between the coating 32 of the laser medium 3 and the partial reflecting mirror 7. When the curvature radii of the coating 32 and the partial reflecting mirror 7 are 400 mm and the resonator length is 10 mm, the beam diameter of the fundamental Gaussian mode is about 0.3 mm. Therefore, the fundamental mode cross-section of the laser and the cross-section in which the pumping light is confined coincide with each other and a high quality Gaussian beam can be output at high efficiency. The reflection coating 31 at the side face of the solid state laser medium 3 can be dispensed with if circumstances allow.

While, in the above-described embodiment, the semiconductor laser 1 is disposed close to the solid state laser medium 3 and the pumping light 2 is directly incident on the solid state laser medium, the pumping light 2 can be incident on the solid state laser medium 3 after the divergence angle of the pumping light 2 is modified by the lens systems 8 and 9, as shown in the ninth embodiment of FIG. 10.

By processing the solid state laser medium together with the holding substance while burying the laser medium in and adhering the laser medium to the holding substance, a curved surface at the facet of the solid state laser medium can be produced precisely. This makes it possible to produce the partially reflecting mirror 7 in the embodiment of FIG. 9(a) at the facet of the solid state laser medium 3.

Figure 11:
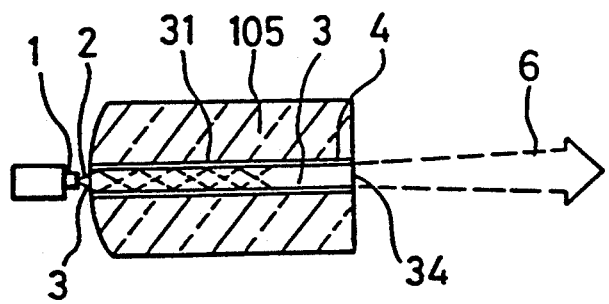

FIG. 11 shows a tenth embodiment of the present invention in which a partially reflecting mirror is produced at the facet of the solid state laser medium. In FIG. 11, numeral 34 designates a coating partially reflecting the laser light 6 on the rear facet of the solid state laser medium 3. In this embodiment, a laser resonator includes both facets of the solid state laser medium 3 and quite a simple and substantial resonator is produced.

In the above-described eighth to tenth embodiments, the configuration of the holding substance 105 and the solid state laser medium 3 are not limited to those described above, and various modifications in the configurations thereof are possible in accordance with resonator structures.

Figure 12:
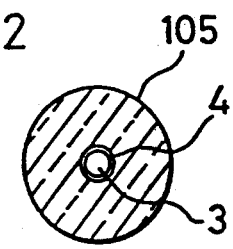
FIGS. 12, 13, and 14 are transverse cross-sectional diagrams showing a semiconductor laser-pumped, solid state laser in accordance with eleventh, twelfth, and thirteenth embodiments of the present invention.

FIG. 12 shows a cross-sectional structure of a solid state laser in accordance with an eleventh embodiment of the present invention. In this embodiment, a circular laser medium 3 having a diameter less than the broadening width of the pumping light in the solid state laser medium is inserted in the holding substance 105, which has a circular hole, and is adhered and affixed thereto.

Figure 13:
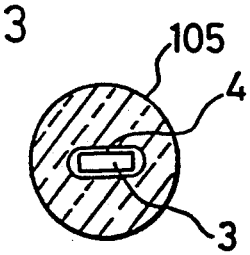

FIG. 13 shows a cross-section structure of a solid state laser in accordance with a twelfth embodiment of the present invention. This embodiment utilizes a plate-shaped solid state laser medium 3 which has a thickness less than the broadening width of the pumping light in the solid state laser medium and has a rectangular cross-section. In this embodiment, the semiconductor laser 1 and the solid state laser medium 3 are arranged such that the direction of the broadening of the pumping light 2 emitted from the semiconductor laser 1 is large and the thickness direction of the solid state laser medium 3, that is, the direction of the short edge of the rectangular medium 3, coincide with each other. Almost the same effects as achieved in the ninth embodiment are obtained.

Figure 14:
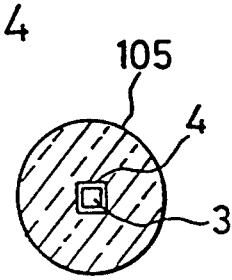
Figure 15A:
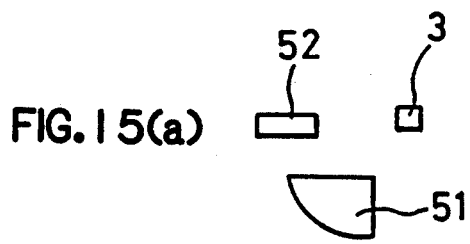
FIGS. 15(a) to 15(d) are diagrams showing production steps using a holding substance for the embodiment of the invention shown in FIG. 14.
Figure 15B:
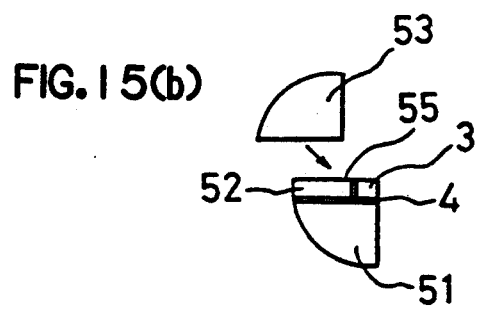
Figure 15C:
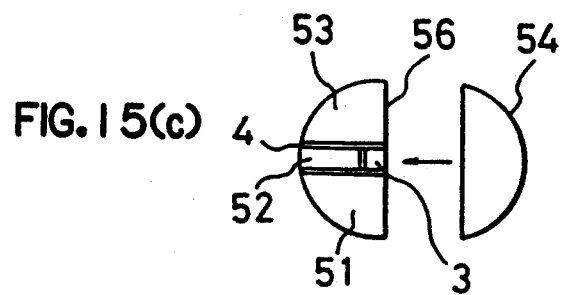
Figure 15D:
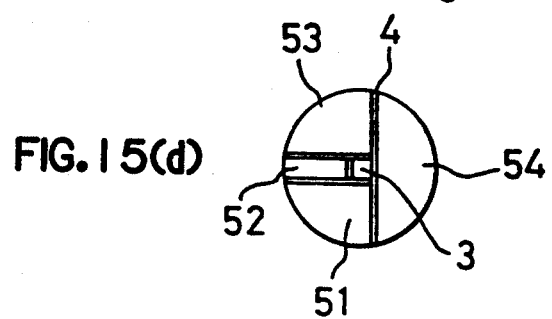

FIG. 14 is a diagram showing a cross-sectional structure of a solid state laser in accordance with a thirteenth embodiment of the present invention. In this embodiment, the solid state laser medium 3, which has a thickness and width less than the broadening width of the pumping light in the solid state laser medium, has a rectangular cross-section. The bar-shaped configuration is adhered and fixed in the holding substance 105 having a rectangular hole. Generally, it is difficult to produce a rectangular hole with high precision but, according to the processes shown in FIGS. 15(a) to 15(d), the holding substance 105, similar to that of FIG. 14, can be easily and precisely produced. As shown in FIG. 15(a), two holding substances 51 and 52 and the solid state laser medium 3 are adhered with adhesive 4. Then, after the side face 55 is polished, together with the solid state laser medium 3, it is adhered to the holding substance 53 with the adhesive 4 as shown in FIG. 15(b). The side face 56 is polished together with the solid state laser medium 3 and, thereafter, it is adhered to the holding substance 54 with adhesive 4 as shown in FIG. 15(c) and the configuration shown in FIG. 15(d) is obtained.

Figure 16A:
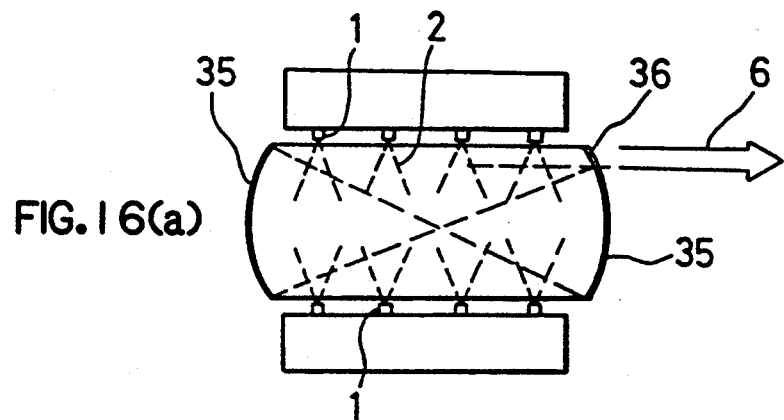
FIGS. 16(a), 16(b), and 16(c) are diagrams showing a semiconductor laser-pumped, solid state laser in accordance wit ha fourteenth embodiment of the present invention.
Figure 16B:
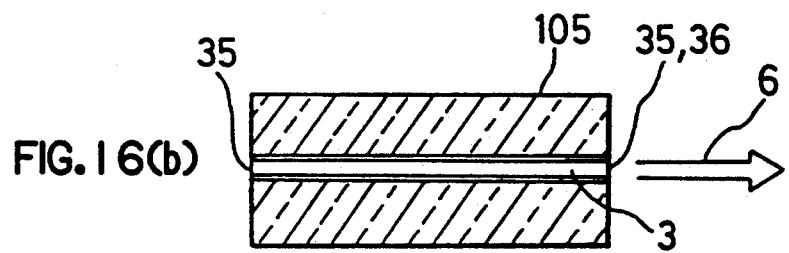
Figure 16C:
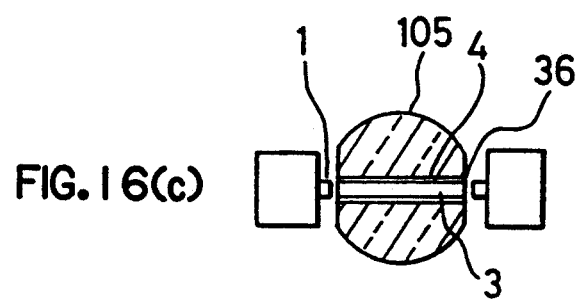

FIGS. 16(a)–16(c) show a fourteenth embodiment of the present invention. In this embodiment, the optical axis of the laser resonator and the optical path of the pumping light are perpendicular to each other. FIGS. 16(a) and 16(b) show vertical cross-sections and FIG. 16(c) shows a transverse cross-section. In FIG. 16(b), the holding substance 105 is a metal or non-metal having good thermal conductivity and is integrated with the solid state laser medium 3. The holding substance is polished as part of a one-dimensional unstable resonator (in the embodiment, a negative-branch co-focal point unstable resonator) and totally reflecting coating 35 and non-reflection coating 36 are disposed on the facets thereof. In this embodiment, a laser resonator includes both facets of the solid state laser medium and, similar to the embodiment of FIG. 11, quite a simple and substantial resonator is obtained.

Figure 17:
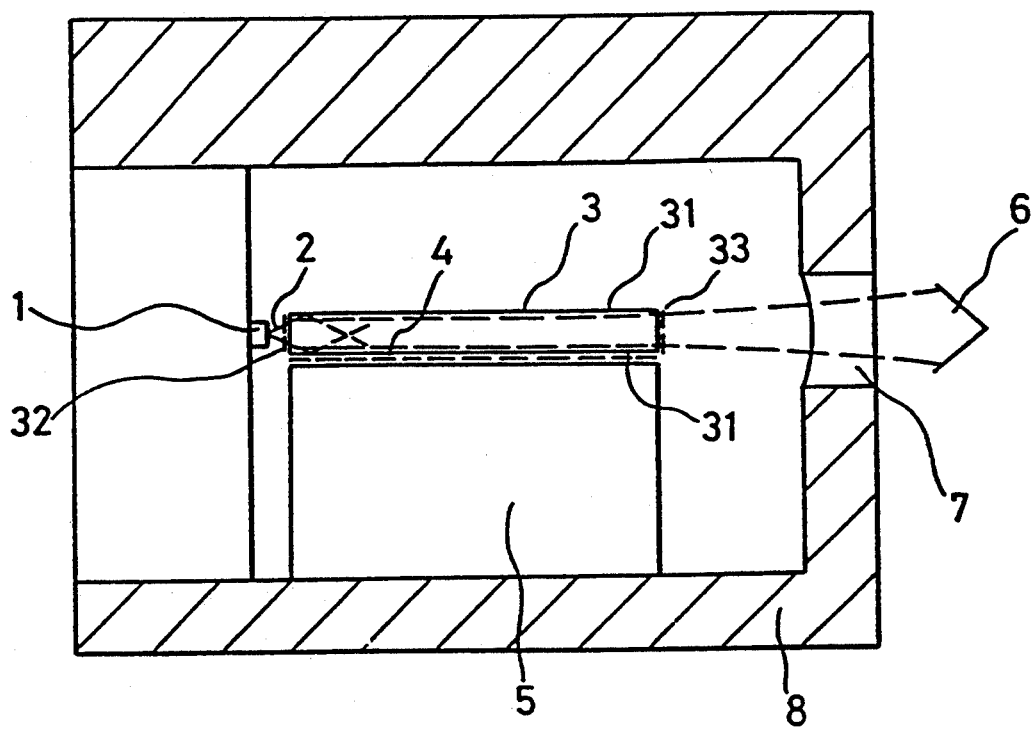
FIG. 17 is a diagram showing a semiconductor laser-pumped, solid state laser in accordance with a fifteenth embodiment of the present invention.

FIG. 17 shows a schematic construction of a semiconductor laser-pumped, solid state laser medium in accordance with a fifteenth embodiment of the present invention. In FIG. 17, reference numeral 1 designates a semiconductor laser generating pumping light. Number 3 is a solid state laser medium comprising, for example, a Nd:YAG ($Y_{3-x}Nd_xAl_5O_{12}$) crystal of rectangular cross-section having a length of 5 mm, a width of 2 mm, and a thickness of 0.5 mm. Numeral 4 designates an optical adhesive. Numeral 5 designates a metal block, for example a gold plated copper rectangular parallelepiped block 5 mm long, 4 mm wide, and 3 mm thick. Numeral 32 designates a coating produced at the facet of the solid state laser medium 3 which is non-reflecting for the pumping light 2 and is totally reflecting for the laser light 6. Numeral 33 designates an optical thin film disposed on the facet of the solid state laser medium 3, highly reflecting the pumping light 2 and not reflecting the laser light 6. Numeral 7 designates a partially reflecting mirror and numeral 8 designates a container.

The pumping light 2 emitted from the semiconductor laser 1 has a generally large anisotropic divergence angle, 60° in the vertical direction and 20° in the horizontal direction of the active layer of the semiconductor laser 1. However, by disposing the semiconductor laser 1 and the solid state laser medium 3 close to each other, the pumping light 2 can be effectively introduced into the laser medium 3.

The pumping light 2 is incident on the facet of the solid state laser medium 3 coated with coating 32. The refractive index of the solid state laser medium 3 is about 1.83 when it is a Nd:YAG crystal laser. When an adhesive which has a refractive index close to 1.5, such as silpot No. 184 made by Dow Corning Company, is used as the optical adhesive 4, it is possible to produce a totally reflecting condition for the pumping light 2 between the solid state laser medium 3 and the optical adhesive 4. On the other hand, it is possible to produce a total reflecting condition for the wider incident angle at the non-adhering plane, that is, the upper surface of the solid state laser medium, through the interface between the solid state laser medium 3 and air. Therefore, the incident pumping light undergoes repeated internal reflections at the upper and lower surfaces 31 of the solid state laser medium 3, is absorbed in the solid state laser medium 3, and effectively excites the laser medium while being confined therein. The light pumping region in the semiconductor laser medium can be about 0.5 mm in both the vertical and horizontal directions. The heat generated in the solid state laser medium 3 is efficiently radiated through the metal block 5 and the container 8.

In this embodiment, a stable resonator includes the coating 32 and the partially reflecting mirror 7. When the coating 32 is a plane coating, the curvature radius of the partially reflecting mirror is 2.5 m and the resonator length is 10 mm, the beam diameter of the fundamental mode (Gaussian mode) is about 0.35 mm. Therefore, the cross-section of the fundamental mode and the cross-section to which the pumping light is confined in the laser coincide with each other and a high quality Gaussian beam can be output at high efficiency.

Figure 18:
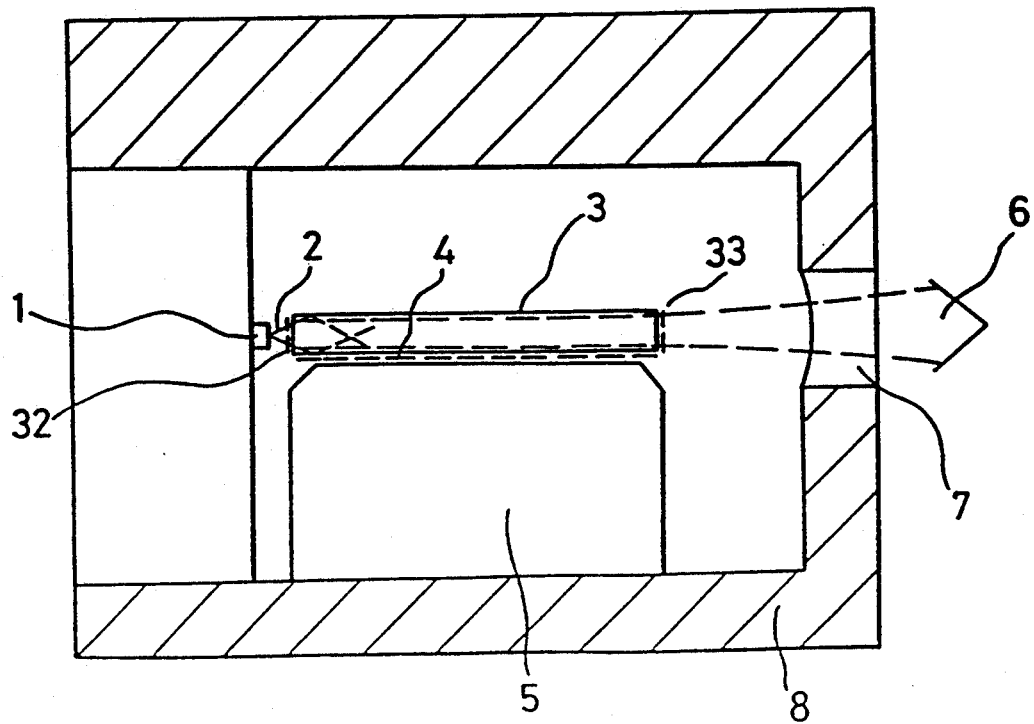
FIGS. 18, 19, 20, 21, and 22 are diagrams showing a semiconductor laser-pumped, solid state laser in accordance with sixteenth, seventeenth, eighteenth, nineteenth, and twentieth embodiments of the present invention, respectively.

FIG. 18 shows a sixteenth embodiment of the present invention where the corners of the metal block 5 adjacent to the facet of the solid state laser medium 3 are removed. By adopting this construction, it is possible to prevent the optical adhesive 4 from bonding to the facet of the solid state laser medium 3.

Figure 19:
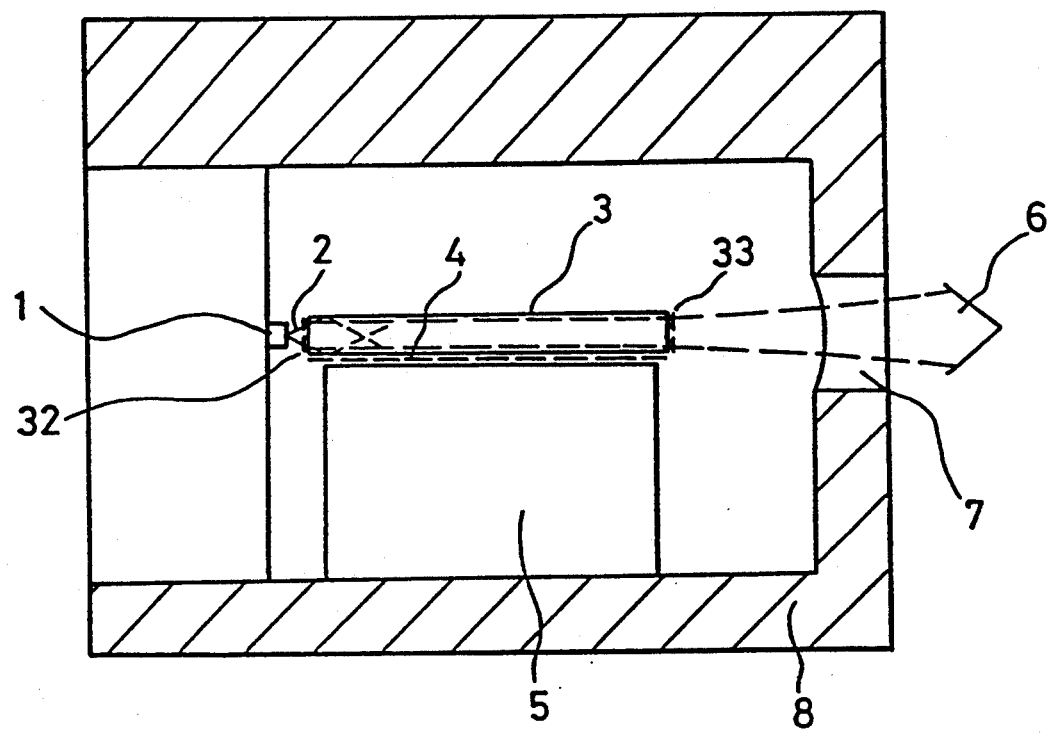

FIG. 19 shows a seventeenth embodiment of the present invention in which the length of the metal block 5 is made slightly less than the length of the solid state laser medium 3. Also in this configuration, the optical adhesive 4 can be prevented from bonding to the facet of the solid state laser medium 3.

Figure 20:
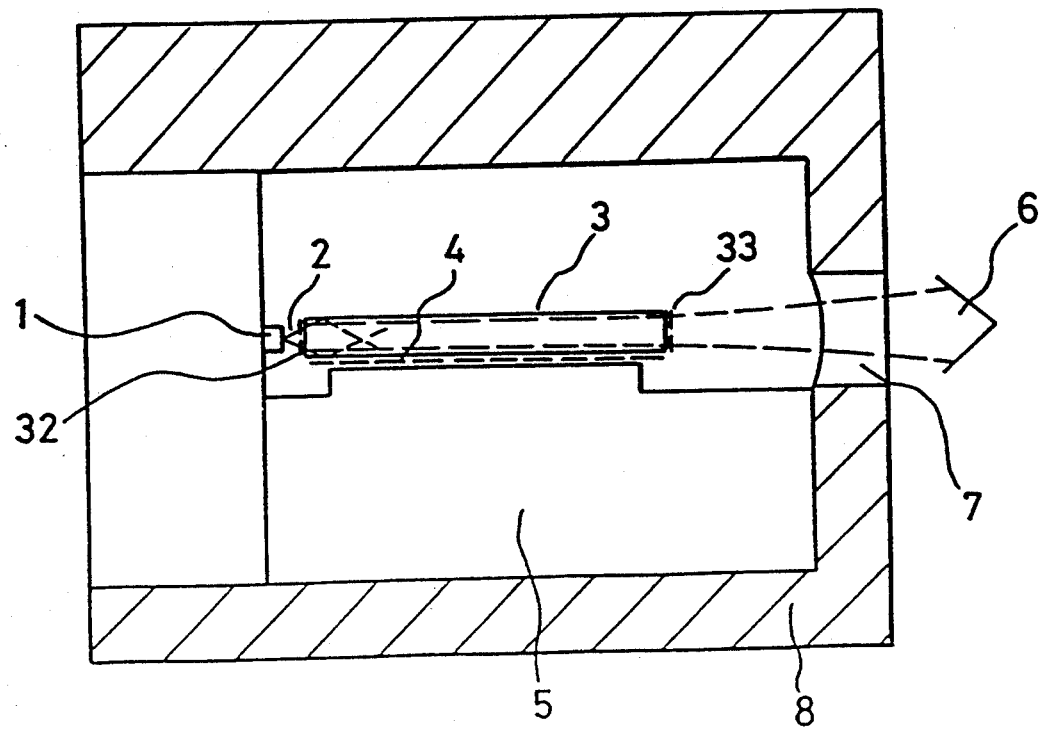

FIG. 20 shows an eighteenth embodiment of the present invention in which the metal block 5 includes a step. In this embodiment, the optical adhesive 4 is prevented from bonding to the facet of the solid state laser medium 3, integration with the semiconductor laser 1 and the partially reflecting mirror 7 is simplified, and a substantial resonator is obtained.

Figure 21:
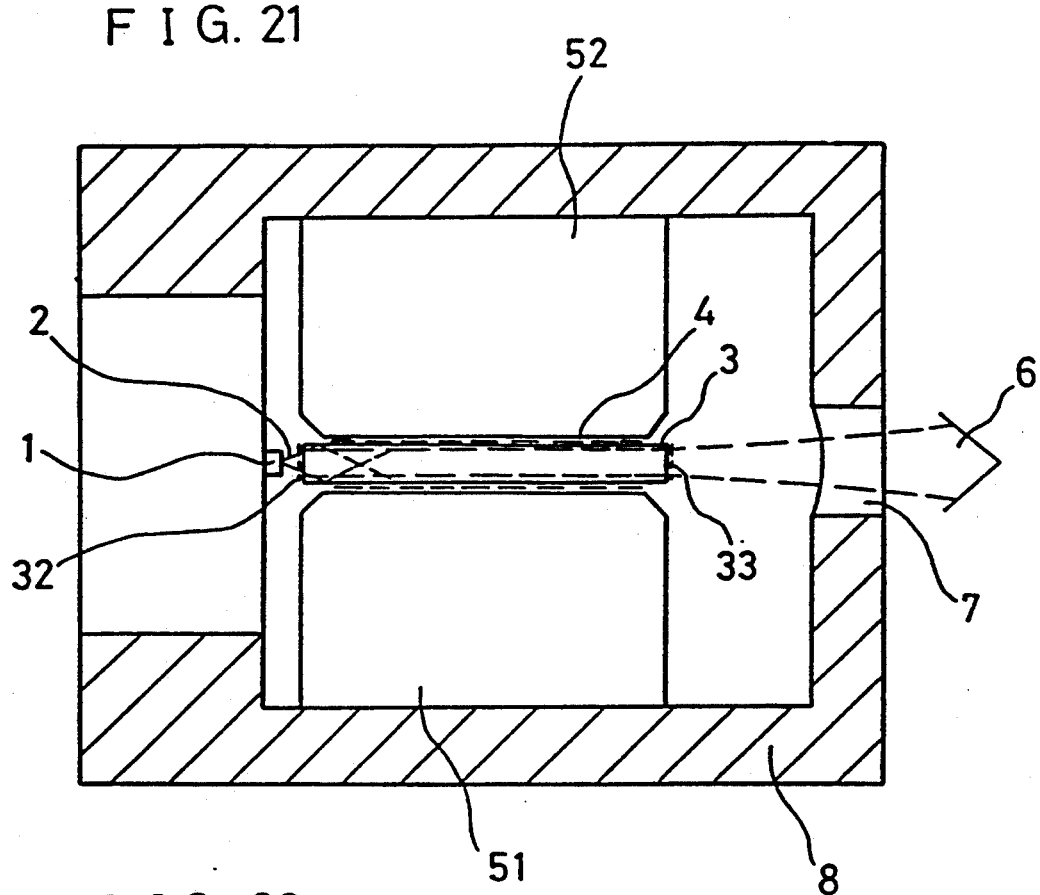

In the above-described fifteenth to eighteenth embodiments, a metal block 5 is adhered only to one side of the solid state laser medium 3. However, as shown in the nineteenth embodiment of the present invention shown in FIG. 21, the metal blocks 51 and 52 can be adhered to both the lower and upper surfaces of the solid state laser medium 3, respectively. In this construction, cooling of the solid state laser medium 3 is improved.

Figure 22:
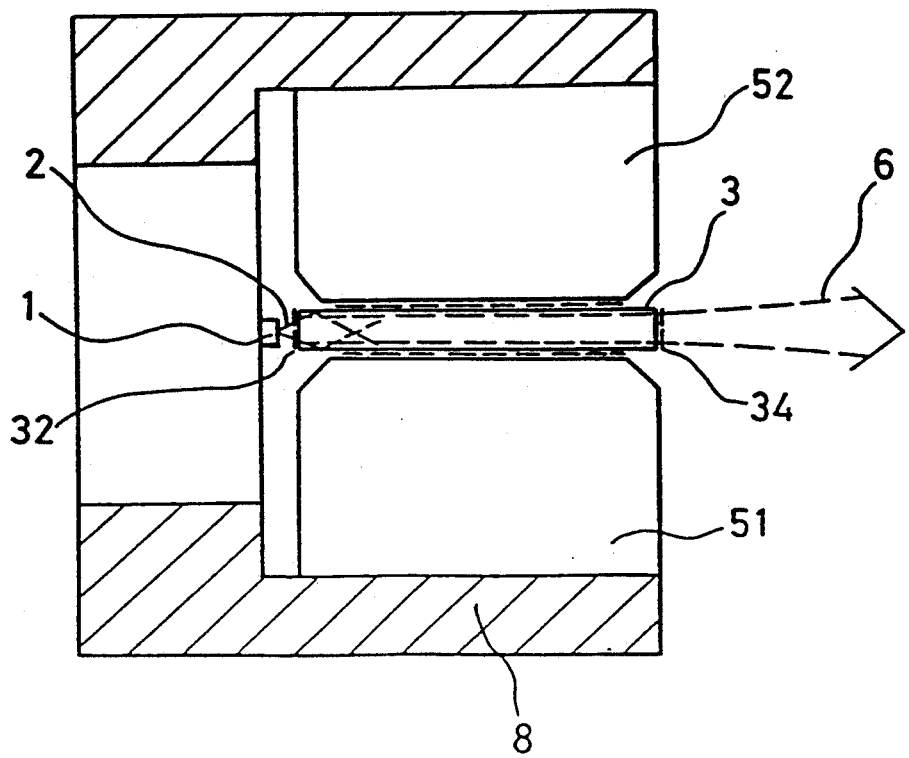

In the above-described embodiment, a stable resonator includes the coating 32 and the partially reflecting mirror 7. However, a partially reflecting mirror can be disposed on the facet of the solid state laser medium 3 as in the twentieth embodiment of the present invention shown in FIG. 22. In FIG. 22, reference numeral 34 designates a partially reflecting coating for the laser light 6 disposed on the rear facet of the solid state laser medium. In this case, a laser resonator includes both facets of the solid state laser medium 3 and a simple and substantial resonator is produced.

In the fifteenth to twentieth embodiments, a facet pumping semiconductor laser-pumped, solid state laser in which the optical axis of the pumping light 2 from the semiconductor laser 1 and the optical axis of the laser light 6 coincide with each other were described. However, also in the side face pumping semiconductor laser-pumped, solid state laser in which optical axes of the pumping light 2 and the laser light 6 are perpendicular, the solid state laser medium may be fixed to a metal block with an optical adhesive. Thus, a solid state laser in which other parts, such as a semiconductor pumping laser and an output mirror, must be mounted is easily produced with a superior cooling effect.

As is evident from the foregoing description, a solid state laser medium is thin, flat, and plate-shaped and has a rectangular cross-section having a thinner thickness and narrower width than the divergence angle of the pumping light in the laser medium or has a circular cross-section of small diameter, less than the divergence angle of the pumping light in the laser medium. The semiconductor pumping laser is disposed close to a facet of the solid state laser medium. The pumping light is incident on the facet of the medium and the laser resonator is stable or a waveguide resonator that has an optical axis in the length direction of the medium, that is, has an optical axis coinciding with the transmission direction of the pumping light. Therefore, the pumping light is confined in a narrow region while repeatedly being internally reflected in the solid state laser medium and has a smaller thickness and a narrower width than the broadening width of the pumping light. The pumping light absorbed is in the medium, whereby the energy efficiency of laser oscillation is enhanced.

In accordance with a second aspect of the present invention, the solid state laser medium is thin, flat, and plate-shaped and plural semiconductor lasers are disposed close to a side face of the solid state laser medium. The pumping light is incident from the side face of the medium and the laser resonator is stable or a one-dimensional unstable resonator that has an optical axis in the length direction of the medium, that is, that has an optical axis perpendicular to the pumping light. Therefore, the region where the optical axis passes is broadened throughout the medium, whereby, even if the positional relationship between the pumping light and the laser light deviates, stable operation is achieved.

In accordance with a third aspect of the present invention, a solid state laser medium is thin, flat, plate-shaped and has a rectangular cross-section thinner in thickness and narrower in width than the broadening angle of the pumping light in the laser medium or a circular cross-section of a small diameter, less than the broadening angle of the pumping light in the laser medium. The facet of the solid state laser medium is optically polished after integrating the laser medium with a holding substance having a large cross-section. Therefore, the surface having the most appropriate curvature for laser oscillation can be easily produced and an efficient and high quality laser beam is realized.

In accordance with a fourth aspect of the present invention, a solid state laser medium is thin, flat, plate-shaped and has a rectangular cross-section having a smaller thickness and narrower width than the broadening angle of the pumping light in the laser medium. The solid state laser medium is fixed to a metal block with an optical adhesive. Therefore, the cooling of the solid state laser medium and mounting of other parts, such as a laser diode or an output mirror, is easy and efficient and a high quality solid state laser beam is produced.

What is claimed is:

1. A semiconductor-laser-pumped, solid-state laser comprising:
    a semiconductor laser for emitting a divergent pumping light beam having an optical axis and a width that broadens with distance from said laser due to divergence of the beam;
    a solid-state laser medium on which the divergent pumping light beam having a width equal to a broadened width is incident, the solid-state laser medium including opposed first and second facets; and
    a laser resonator structure having an optical axis for emitting laser light from and confining light in said solid-state laser medium, wherein said solid-state medium is plate shaped and has a thickness less than the broadened width of the pumping light in said solid-state laser medium and the optical axis of said laser resonator structure coincides with the optical axis of the pumping light.

2. A semiconductor-laser-pumped, solid-state laser as defined in claim 1, including said laser resonator structure is a stable resonator.

3. A semiconductor-laser-pumped, solid-state laser as defined in claim 2, wherein a selective reflecting film which transmits said pumping light and totally reflects said laser light is disposed on said first facet of said solid-state laser medium.

4. A semiconductor-laser-pumped, solid-state laser as defined in claim 3, including a partially reflecting mirror disposed opposite the second facet of said solid-state laser medium as said stable resonator between said partially reflecting mirror and said selective reflecting film.

5. A semiconductor-laser-pumped, solid-state laser as defined in claim 1, including high dielectric constant guides disposed on both surfaces of said solid-state laser medium to produce a waveguide resonator in said solid-state laser medium.

6. A semiconductor-laser-pumped, solid-state laser comprising:
    a semiconductor laser for emitting a divergent pumping light beam having an optical axis and a width that broadens with distance from said laser due to divergence of the beam;
    a solid-state laser medium on which the divergent pumping light beam having a width equal to a broadened width is incident, the solid-state laser medium including opposed first and second facets; and
    a laser resonator structure having an optical axis for emitting laser light from and confining light in said solid-state laser medium, wherein said solid-state laser medium has a rectangular cross-section having a thickness and a width less than the broadened width of the pumping light in said solid-state laser medium, said semiconductor laser is disposed close to the first facet of said solid-state laser medium and the optical axis of said laser resonator structure coincides with the optical axis of the pumping light.

7. A semiconductor-laser-pumped, solid-state laser as defined in claim 6, wherein said laser resonator structure is a stable resonator.

8. A semiconductor-laser-pumped, solid-state laser as defined in claim 7, including a selective reflecting film which transmits said pumping light and totally reflects said laser light disposed on said solid-state laser medium.

9. A semiconductor-laser-pumped, solid-state laser as defined in claim 8, including a partial reflecting mirror disposed opposite to the second facet of said solid-state laser medium as said stable resonator between said partially reflecting mirror and said selective reflecting film.

10. A semiconductor-laser-pumped, solid-state laser comprising:
    a semiconductor laser for emitting a divergent pumping light beam having an optical axis and a width that broadens with distance from said laser due to divergence of the beam;
    a solid-state laser medium on which the divergent pumping light beam having a width equal to a broadened width is incident, the solid-state laser medium including opposed first and second facets; and
    a laser resonator structure having an optical axis for emitting laser light from and confining light in said solid-state laser medium, wherein said solid-state laser medium has a circular cross-section and a diameter less than the broadened width of the pumping light in said solid-state laser medium, said semiconductor laser is disposed close to the first facet of said solid-state laser medium and the optical axis of said laser resonator structure coincides with the optical axis of the pumping light.

11. A semiconductor-laser-pumped, solid-state laser as defined in claim 10, wherein said laser resonator structure is a stable resonator.

12. A semiconductor-laser-pumped, solid-state laser as defined in claim 11, including a selective reflecting film which transmits said pumping light and totally reflects said laser light disposed on said facet of said solid-state laser medium.

13. A semiconductor-laser-pumped, solid-state laser as defined in claim 12, including a partially reflecting mirror disposed opposite to the second facet of said solid-state laser medium as said stable resonator between said partial reflecting mirror and said selective reflecting film.

* * * * *